(12) United States Patent
Yan

(10) Patent No.: US 8,716,725 B2
(45) Date of Patent: May 6, 2014

(54) PACKAGE FOR MULTIPLE LIGHT EMITTING DIODES

(71) Applicant: LedEngin, Inc., San Jose, CA (US)

(72) Inventor: Xiantao Yan, Palo Alto, CA (US)

(73) Assignee: LedEngin, Inc., San Jose, CA (US)

( * ) Notice: Subject to any disclaimer, the term of this patent is extended or adjusted under 35 U.S.C. 154(b) by 0 days.

(21) Appl. No.: 13/774,414

(22) Filed: Feb. 22, 2013

(65) Prior Publication Data

US 2014/0049958 A1    Feb. 20, 2014

Related U.S. Application Data

(63) Continuation of application No. 12/756,861, filed on Apr. 8, 2010, now Pat. No. 8,384,097.

(60) Provisional application No. 61/167,761, filed on Apr. 8, 2009.

(51) Int. Cl.
*H01L 29/18* (2006.01)

(52) U.S. Cl.
USPC .............. 257/88; 257/666; 438/25; 438/28; 438/123

(58) Field of Classification Search
CPC ...................................................... H01L 29/18
USPC ........................................................ 257/98, 88
See application file for complete search history.

(56) References Cited

U.S. PATENT DOCUMENTS

| | | | |
|---|---|---|---|
| 5,959,316 A | 9/1999 | Lowery | |
| 6,307,160 B1 | 10/2001 | Mei et al. | |
| 6,351,069 B1 | 2/2002 | Lowery et al. | |
| 6,495,964 B1 | 12/2002 | Muthu et al. | |
| 6,608,332 B2 | 8/2003 | Shimizu et al. | |
| 6,614,179 B1 | 9/2003 | Shimizu et al. | |
| 6,642,652 B2 | 11/2003 | Collins, III et al. | |

(Continued)

FOREIGN PATENT DOCUMENTS

| | | |
|---|---|---|
| JP | 2000-349346 | 12/2000 |
| JP | 2000-349347 | 12/2000 |

(Continued)

OTHER PUBLICATIONS

Notice of Allowance mailed Jul. 25, 2013 in U.S. Appl. No. 13/106,808, 9 pages.

(Continued)

*Primary Examiner* — Ajay K Arora
(74) *Attorney, Agent, or Firm* — Kilpatrick Townsend & Stockton LLP

(57) ABSTRACT

Substrates and packages for LED-based light devices can significantly improve thermal performance and provide separate electrical and thermal paths through the substrate. One substrate includes multiple electrically insulating base layers. On a top one of these layers are disposed top-side electrical contacts, including light device pads to accommodate a plurality of light devices. External electrical contacts are disposed on an exterior surface of the substrate. Electrical paths connect the top-side electrical contacts to the external electrical contacts. At least portions of some of the electrical paths are disposed between the electrically insulating base layers. The electrical paths can be arranged such that different subsets of the light device pads are addressable independently of each other. A heat dissipation plate can be formed on the bottom surface of a bottom one of the base layers.

13 Claims, 18 Drawing Sheets

(56) References Cited

U.S. PATENT DOCUMENTS

| | | |
|---|---|---|
| 6,680,128 B2 | 1/2004 | Mei |
| 6,791,116 B2 | 9/2004 | Takahashi et al. |
| 6,828,170 B2 | 12/2004 | Roberts et al. |
| 7,064,353 B2 | 6/2006 | Bhat |
| 7,139,125 B1 | 11/2006 | Mi |
| 7,156,538 B2 | 1/2007 | Han et al. |
| 7,157,744 B2 | 1/2007 | Palmteer et al. |
| 7,168,608 B2 | 1/2007 | Mei |
| 7,199,446 B1 | 4/2007 | Mei et al. |
| 7,264,378 B2 | 9/2007 | Loh |
| 7,465,069 B2 | 12/2008 | Li |
| 7,473,933 B2 | 1/2009 | Yan |
| 7,670,872 B2 | 3/2010 | Yan |
| 7,772,609 B2 | 8/2010 | Yan |
| 8,384,097 B2 | 2/2013 | Yan |
| 2001/0015778 A1 | 8/2001 | Murade |
| 2002/0004251 A1 | 1/2002 | Roberts et al. |
| 2002/0015013 A1 | 2/2002 | Ragle |
| 2002/0163006 A1 | 11/2002 | Yoganandan et al. |
| 2002/0191885 A1 | 12/2002 | Wu et al. |
| 2003/0016899 A1 | 1/2003 | Yan |
| 2003/0086674 A1 | 5/2003 | Yan et al. |
| 2003/0095399 A1 | 5/2003 | Grenda et al. |
| 2003/0116769 A1 | 6/2003 | Song et al. |
| 2003/0122482 A1 | 7/2003 | Yamanaka et al. |
| 2003/0227249 A1 | 12/2003 | Mueller et al. |
| 2003/0230977 A1 | 12/2003 | Epstein |
| 2004/0004437 A1 | 1/2004 | Shimizu et al. |
| 2004/0051111 A1 | 3/2004 | Ota et al. |
| 2004/0079957 A1 | 4/2004 | Andrews et al. |
| 2004/0087165 A1* | 5/2004 | Theiss et al. ............ 438/694 |
| 2004/0102061 A1 | 5/2004 | Watanabe |
| 2004/0114393 A1 | 6/2004 | Galli |
| 2004/0126918 A1 | 7/2004 | Kurahashi et al. |
| 2004/0150991 A1 | 8/2004 | Ouderkirk et al. |
| 2004/0173810 A1 | 9/2004 | Lin et al. |
| 2004/0201025 A1 | 10/2004 | Barnett |
| 2004/0257496 A1 | 12/2004 | Sonoda |
| 2005/0035364 A1 | 2/2005 | Sano et al. |
| 2005/0093146 A1 | 5/2005 | Sakano |
| 2005/0127281 A1 | 6/2005 | Zheng et al. |
| 2005/0145872 A1 | 7/2005 | Fang et al. |
| 2005/0179376 A1 | 8/2005 | Fung et al. |
| 2005/0199900 A1 | 9/2005 | Lin et al. |
| 2005/0224830 A1 | 10/2005 | Blonder et al. |
| 2005/0253242 A1 | 11/2005 | Costello et al. |
| 2005/0286131 A1 | 12/2005 | Saxena et al. |
| 2006/0012299 A1 | 1/2006 | Suehiro et al. |
| 2006/0063287 A1 | 3/2006 | Andrews |
| 2006/0082296 A1 | 4/2006 | Chua et al. |
| 2006/0082679 A1 | 4/2006 | Chua et al. |
| 2006/0091416 A1 | 5/2006 | Yan |
| 2006/0091788 A1 | 5/2006 | Yan |
| 2006/0097385 A1 | 5/2006 | Negley |
| 2006/0170332 A1 | 8/2006 | Tamaki et al. |
| 2006/0284209 A1 | 12/2006 | Kim et al. |
| 2007/0023769 A1 | 2/2007 | Nishimoto et al. |
| 2007/0081360 A1 | 4/2007 | Bailey et al. |
| 2007/0139437 A1* | 6/2007 | Boroson et al. ............ 345/590 |
| 2007/0194341 A1 | 8/2007 | Chang et al. |
| 2007/0241357 A1 | 10/2007 | Yan |
| 2008/0308825 A1 | 12/2008 | Chakraborty et al. |
| 2011/0012512 A1 | 1/2011 | Young et al. |
| 2012/0286669 A1 | 11/2012 | Yan et al. |

FOREIGN PATENT DOCUMENTS

| | | |
|---|---|---|
| JP | 2001-057445 | 2/2001 |
| JP | 2002185046 | 6/2002 |
| JP | 2004241704 | 8/2004 |
| JP | 2004-253404 | 9/2004 |

OTHER PUBLICATIONS

Office Action mailed Apr. 12, 2013 in U.S. Appl. No. 13/106,808, 10 pages.

Kading, "Thermal conduction in metallized silicon-dioxide layers on silicon," Appl. Phys. Lett 65, 1994, pp. 1629-1631.

Yan, Xiantao, et al., "Two Test Specimens for Determining the Interfacial Fracture Toughness in Flip-Chip Assemblies," Transactions of the ASME, vol. 120, Jun. 1998, p. 150.

Yan, Xiantao, "Analysis Based Design Guidelines for Metal Runner and Passivation Layers in IC Packaging," Delphi Automotive Systems Analytical Engineering Conference, May 2000, p. 1.

"Solvent Soluble Polyimide with High Transparency and High Tg: HOP-400, 500", Hitachi Cable Review, Aug. 2003, No. 22, p. 78.

Official Action for Japanese patent application No. 2005-315149, Japan Patent Office, Jul. 21, 2009, pp. 1-3, 1-2.

* cited by examiner

| Peripheral Pad | Top Bonding Pad(s) |
|---|---|
| 420a | 410d |
| 420b | 410a |
| 420c | 412a |
| 420d | 412b |
| 420e | 410b |
| 420f | 412e |
| 420g | 410e |
| 420h | 410f |
| 420i | 412f |
| 420j | 412j |
| 420k | 410j |
| 420l | 412i |
| 420m | 410i |
| 420n | 410l |
| 420o | 412l |
| 420p | 412k |
| 420q | 410k |
| 420r | 412h |
| 420s | 410h |
| 420t | 410g |
| 420u | 412g |
| 420v | 412c |
| 420w | 410c |
| 420x | 412d |

*FIG. 4C*

| Peripheral Pad | Top Bonding Pad(s) |
|---|---|
| 520a | --- |
| 520b | 512m |
| 520c | 510m |
| 520d | --- |
| 520e | 510n |
| 520f | 512n |
| 520g | --- |
| 520h | 510f |
| 520i | 510f |
| 520j | --- |
| 520k | 510j |
| 520l | 510j |
| 520m | --- |
| 520n | 512p |
| 520o | 510p |
| 520p | --- |
| 520q | 510o |
| 520r | 512o |
| 520s | --- |
| 520t | 512g |
| 520u | 512g |
| 520v | --- |
| 520w | 512c |
| 520x | 512c |

FIG. 5C

PACKAGE FOR MULTIPLE LIGHT EMITTING DIODES

CROSS-REFERENCE TO RELATED APPLICATIONS

This application is a continuation of U.S. patent application Ser. No. 12/756,861, filed Apr. 8, 2010, which claims the benefit of U.S. Provisional Application No. 61/167,761, filed Apr. 8, 2009, entitled "Package for Multiple Light Emitting Diodes." The disclosures of both applications are incorporated by reference herein in their entirety.

BACKGROUND OF THE INVENTION

Embodiments of the present invention relate to solid-state light devices, and more specifically to packages for solid-state light devices.

A light-emitting diode (LED) is a semiconductor device that produces light when an electric current is passed therethrough. LEDs have many advantages over conventional lighting sources, including compact size, low weight, longer life time, high vibration resistance, and higher reliability. In addition to having widespread applications for electronic products as indicator lights, LEDs also have become an important alternative light source for various applications where incandescent and fluorescent lamps have traditionally dominated.

Additionally, wider applicability of LEDs has been made possible through the use of phosphors in conjunction with LEDs. A phosphor is a luminescent material that, when excited by a light of a certain wavelength, produces a light at a different wavelength, thus modifying the output light of the LED. Accordingly, where a particular color is desired and that color cannot be produced by available LEDs cost effectively, phosphors can be used as light "converters" to alter the color of the light produced by an available LED to the desired color.

For example, phosphors are now used with monochromatic LEDs to produce white light. Using phosphors to convert the light produced by an LED to white light has proven to be a viable alternative to conventional white light sources, including incandescent light sources and the direct red-green-blue (RGB) LED methods in which multiple monochromatic LEDs are combined in a RGB scheme to produce white light.

In a typical LED-based white light producing device, a monochromatic LED is encapsulated by a transparent material containing appropriate compensatory phosphors. The wavelength(s) of the light emitted from the compensatory phosphor is compensatory to the wavelength of the light emitted by the LED such that the wavelengths from the LED and the compensatory phosphor mix together to produce white light. For instance, a blue LED-based white light source produces white light by using a blue light LED and a phosphor that emits a yellowish light when excited by the blue light emitted from the LED. In these devices the amount of the phosphor in the transparent material is controlled such that only a fraction of the blue light is absorbed by the phosphor while the remainder passes unabsorbed. The yellowish light and the unabsorbed blue light mix to produce white light.

Another exemplary scheme uses an LED that produces light outside of the visible spectrum, such as ultraviolet (UV) light, together with a mixture of phosphors capable of producing either red, green, or blue light when excited. In this scheme, the light emitted by the LED only serves to excite the phosphors and does not contribute to the final color balance.

To provide an operational lamp, one or more LED dice are typically mounted on a substrate that provides electrical contacts and mechanical couplings and covered with one or more layers of optically transparent and/or wavelength-shifting materials, in some cases including a primary lens to direct the exiting light. This combination of LEDs, substrate, and optical materials is sometimes referred to as a "package." The lamp itself may also include a secondary lens, heat sink, mechanical and/or electrical connections allowing the lamp to be installed in a light fixture, and so on.

As demand for better lighting devices continues to increase, it would be desirable to provide cost-effective LED-based lighting sources having high brightness.

BRIEF SUMMARY OF THE INVENTION

Brightness of existing LED-based lamps is limited in part by problems of thermal management. Operating LEDs produce considerable heat as well as light. As the operating current (or power) of an LED increases, more heat is produced. The heat must be channeled away from the LED, as overheating will damage the LED die. Existing packages often limit the overall brightness of an LED-based lamp by limiting the amount of heat that can be dissipated.

Embodiments of the present invention provide substrates and packages for LED-based light devices that can significantly improve thermal performance, allowing the LEDs to operate at higher current and therefore higher brightness. In addition, some embodiments provide improved electrical properties by providing separate electrical and thermal paths through the substrate. The separation of electrical and thermal paths further allows different operating current to be supplied to different LEDs, enhancing the ability to control the light output of the device.

One aspect of the present invention relates to a substrate for lighting apparatus. In one embodiment, the substrate includes multiple electrically insulating base layers. A number of top-side electrical contacts, including light device pads sized and positioned to accommodate a plurality of light devices, are disposed on a top one of the electrically insulating base layers. A number of external electrical contacts are disposed on an exterior surface of the substrate. Electrical paths connect the top-side electrical contacts to the external electrical contacts. At least portions of some of the electrical paths are disposed between the electrically insulating base layers. The electrical paths can be arranged such that different subsets of the light device pads are addressable independently of each other.

In another embodiment, a substrate includes multiple base layers of an electrically insulating material. A number of top-side electrical contacts, including a plurality of light device pads, are disposed on a top one of the base layers. Each of the light device pads can have a larger size than a light device to be disposed thereon. A number of external electrical contacts are disposed on an exterior surface of the substrate. Electrical paths connect the top-side electrical contacts to the external electrical contacts, and at least portions of some of the electrical paths are disposed between the base layers. A metal heat dissipation plate disposed on a bottom surface of a bottom one of the layers and is electrically isolated from the plurality of external contact pads.

Another aspect of the present invention relates to methods of manufacturing substrates for lighting apparatus. In various embodiments, substrate layers can be fabricated from various materials such as ceramics that are good electrical insulators and good thermal conductors. The electrically conductive portions can include metal traces and pads applied to the layers during fabrication. In some embodiments, metal traces and pads can include sub-layers of multiple different metals (e.g., tungsten, nickel, gold, and silver).

Another aspect of the present invention relates to packages for use in lamps and other lighting applications. In some embodiments, a package can include a substrate (e.g., any of the embodiments described above), light devices (e.g., LEDs and/or light sensors) mounted on and electrically connected to the top-side electrical contacts, and a primary lens disposed over the light devices. A region between the light devices and the primary lens can be filled with an optically transparent medium that can provide, for example, optical index-matching and adhesive properties to hold the primary lens in position.

The following detailed description together with the accompanying drawings will provide a better understanding of the nature and advantages of the present invention.

BRIEF DESCRIPTION OF THE DRAWINGS

FIG. 3A is a simplified top view of a substrate; FIG. 3B is a simplified cutaway top view of the substrate of FIG. 3A; FIG. 3C is a simplified schematic illustration of the electrical connections among certain components shown in FIG. 3B; and FIG. 3D is a bottom view of the substrate of FIG. 3A.

FIGS. 4A-4F illustrate a 12-LED package according to another embodiment of the present invention. More specifically, FIG. 4A is a simplified top view of a substrate; FIG. 4B is a simplified cutaway top view of the substrate of FIG. 4A; FIG. 4C is a table identifying electrical connections among certain components shown in FIG. 4B; FIG. 4D is a simplified schematic illustration of the electrical connections among certain components shown in FIG. 4B; FIG. 4E is a simplified schematic illustration of another configuration of electrical connections among certain components shown in FIG. 4B; and FIG. 4F is a bottom view of the substrate of FIG. 4A.

FIGS. 5A-5F illustrate a 16-LED package according to another embodiment of the present invention. More specifically, FIG. 5A is a simplified top view of a substrate; FIG. 5B is a cutaway top view of the substrate of FIG. 5A; FIG. 5C is a table identifying electrical connections among certain components shown in FIG. 5B; FIG. 5D is a simplified schematic illustration of the electrical connections among certain components shown in FIG. 5B; FIG. 5E is a simplified block diagram of a dynamic feedback and control system that can be used in conjunction with the substrate of FIG. 5A; and FIG. 5F is a bottom view of the substrate of FIG. 5A.

DETAILED DESCRIPTION OF THE INVENTION

Embodiments of the present invention provide substrates and packages for LED-based light devices that can significantly improve thermal performance, allowing the LEDs to operate at higher current and therefore higher brightness. In addition, some embodiments provide improved electrical properties by providing separate electrical and thermal paths through the substrate. The separation of electrical and thermal paths further allows different operating current to be supplied to different LEDs, enhancing the ability to control the light output of the device.

Figure 1:
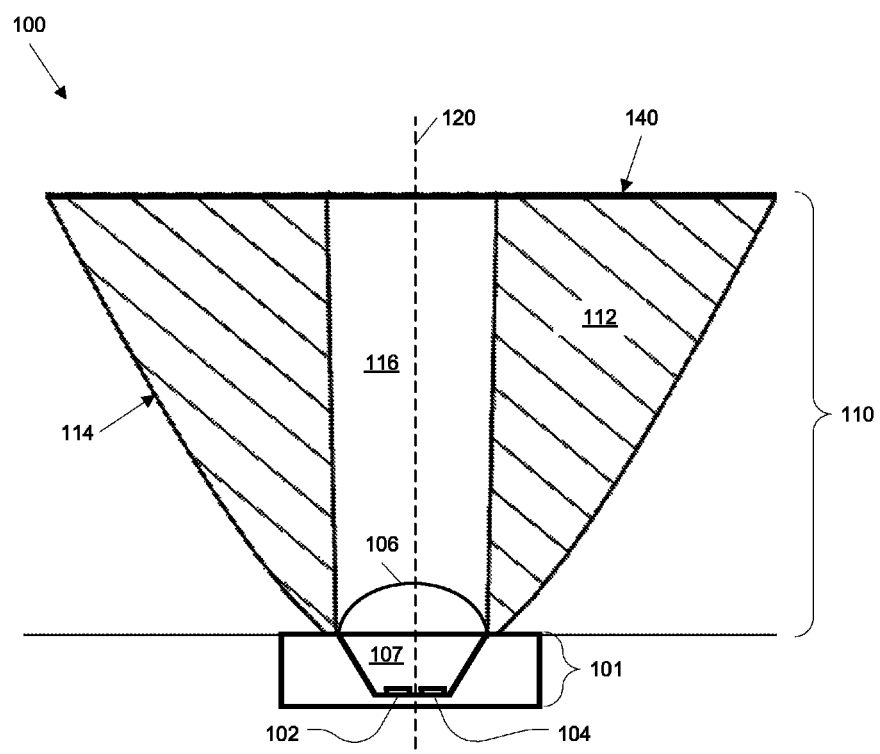
FIG. 1 is a simplified cross-sectional view of a lamp according to an embodiment of the present invention.

FIG. 1 is a simplified cross-sectional view of a lamp according to an embodiment of the present invention. As shown, lamp 100 includes light source substrate 101, primary lens 106, and secondary lens 110. Light source substrate 101 can include multiple LEDs, two of which, 102 and 104, are shown in FIG. 1. Any number and type of LEDs may be used. In one embodiment, each LED is a blue LED (any LED that emits light in the blue region of the electromagnetic spectrum) and has a coating of a material containing yellow phosphor applied over its top surface. The yellow phosphor shifts the wavelength of some of the blue light into the yellow region of the electromagnetic spectrum, and the resulting mixture of blue and yellow light yields a white light source. Further details related to coating and arranging LEDs to produce light of a desired color are described in commonly-owned U.S. patent application Ser. No. 12/420,800, filed Apr. 8, 2009, entitled "Lighting Apparatus Having Multiple Light-Emitting Diodes with Individual Light-Conversion Layers." Such arrangements of LEDs can be used in a lamp in conjunction with package embodiments described below. However, it is to be understood that the present invention is not limited to any particular type or arrangement of LEDs.

Primary lens 106 overlies substrate 101. As shown, LEDs 102, 104 can be arranged in a cavity 107 within substrate 101. The sides of cavity 107 can be coated with reflective material. Cavity 107 can be empty, or it can be filled with an optically transparent substance (e.g., silicone, glass, sol-gel) that provides index matching to LEDs 102, 104 and/or primary lens 106. In some embodiments, cavity 107 may also contain a wave-shifting material (e.g., phosphor) for altering the color of light emitted by LEDs 102, 104.

Lamp 100 has a secondary lens 110 overlying substrate 101 and primary lens 106. In an embodiment, secondary lens 110 is configured to mix light from LEDs 102, 104 at least partially via total internal reflection. Additionally, lens 110 can be configured to provide substantially centered projected light even when the light source is positioned off the optical axis. (For example, both LEDs 102 and 104 in FIG. 1 are positioned off the optical axis 120.)

In a specific embodiment, secondary lens 110 has a body member 112, which has an outer surface region 114 and an interior open channel 116 that extends longitudinally through the body member 112. Body member 112 and interior open channel 116 are substantially symmetric with respect to optical axis 120. In an embodiment, the outer surface region 114 is shaped to provide total internal reflection. The end region opposite substrate 101 has a circular surface 140, which can be shaped into microlenses that provide control over the shape of the emitted light. Further examples of a secondary lens suitable for use in lamp 100 can be found in commonly-owned U.S. patent application Ser. No. 12/420,802, filed Apr. 8, 2009, entitled "Total Internal Reflection Lens and Mechanical Retention and Locating Device." It is to be understood that other lenses can also be used and that the present invention is not limited to a particular lens (or indeed to any lens at all).

Lamp 100 may also have a power control circuit (not shown) coupled to LEDs 102, 104. In particular, substrate 101 advantageously provides electrical connection paths from its outer surface to LEDs 102, 104. As described below, different connection paths can be provided to different LEDs, and the power control circuit may be configured to supply different current to different LEDs, thereby allowing relative brightness of different LEDs within lamp 100 to be controlled.

Figure 2:
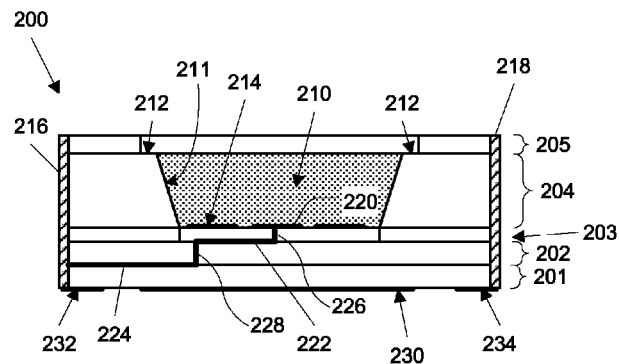
FIG. 2 is a simplified side view of a substrate for an LED package according to an embodiment of the present invention.

FIG. 2 is a simplified side view of a substrate 200 for an LED package according to an embodiment of the present invention. Substrate 200 is formed as a series of layers 201-205 of a ceramic material (e.g., alumina or aluminum nitride (AlN)). Layers 201-205 have different thicknesses that can be optimized to control thermal expansion and thermal stress. For example, layers 201 and 202 can be 0.15 millimeters (mm) each, layer 203 can be 0.10 mm, layer 204 can be 0.50 mm, and layer 205 can be 0.15 mm, for a total thickness of 1.05 mm.

Upper layers 204 and 205 define a recess 210 within which one or more LEDs (not shown) can be placed. In one embodiment, recess 210 has the shape of a truncated cone; sidewall 211 is circular and slanted inward, e.g., at an angle of about 20° with respect to the vertical axis. Sidewall 211 of recess 210 can be coated with a reflective material (e.g., silver) to increase light output of the device.

Upper layer 205 can provide a circular opening, allowing light to escape from recess 210. In this embodiment, the edge of layer 205 is set back from the edge of layer 204 at the periphery of recess 210, thereby forming a ledge 212 upon which a primary lens can be placed.

Layers 201-203 provide a base for the package. A patterned metal layer 214 is deposited on top-most base layer 203 within recess 210. Patterned metal layer 214 provides various bond pads (e.g., pad 220) for electrical contacts to LEDs disposed within recess 210. (These are referred to herein as "top-side" bond pads because they are on the topmost one of the base layers.) Specific examples are described below, but it will be appreciated that the present invention is not limited to any particular configuration of bond pads or of metal layer 214.

External electrical contacts 216, 218 are provided at a peripheral edge of substrate 200. In one embodiment, external contacts 216, 218 include metal coatings that extend vertically along the entire thickness of substrate 200. Any number of external contacts can be provided. Each top-side bond pad of patterned metal layer 214 can be connected to one (or more) of the external electrical contacts, e.g., using metal lines disposed between ceramic layers and metal vias passing through the ceramic layers. By way of illustration, FIG. 2 shows top-side bond pad 220 connected to external contact 216 by interlayer metal lines 222, 224 and vias 226, 228. Any configuration of connections may be used. Further, in some embodiments, some of the top-side bond pads can be connected to each other by interlayer metal lines and vias that do not connect to external electrical contacts. In some embodiments, as described below, the electrical connections are arranged such that power can be supplied separately to different LEDs or groups of LEDs. In some embodiments, external contacts 216, 218 may also extend inward on the bottom surface of substrate 200, e.g., as bottom metal pads 232, 234.

A metal plate 230 is disposed on the bottom surface of bottom layer 201. Metal plate 230, which is advantageously circular and as large as possible in some embodiments, provides a metallic surface for attaching a heat sink. Metal plate 230 is advantageously electrically isolated from the various electrical paths and pads that may be present on, within, and/or under substrate 200.

As noted above, substrate 200 can be used to support any number and arrangement of LEDs. Specific examples of 4-LED, 12-LED, and 16-LED configurations will now be described. Those skilled in the art with access to the present teachings will understand that many other configurations are also possible.

Figure 3A:
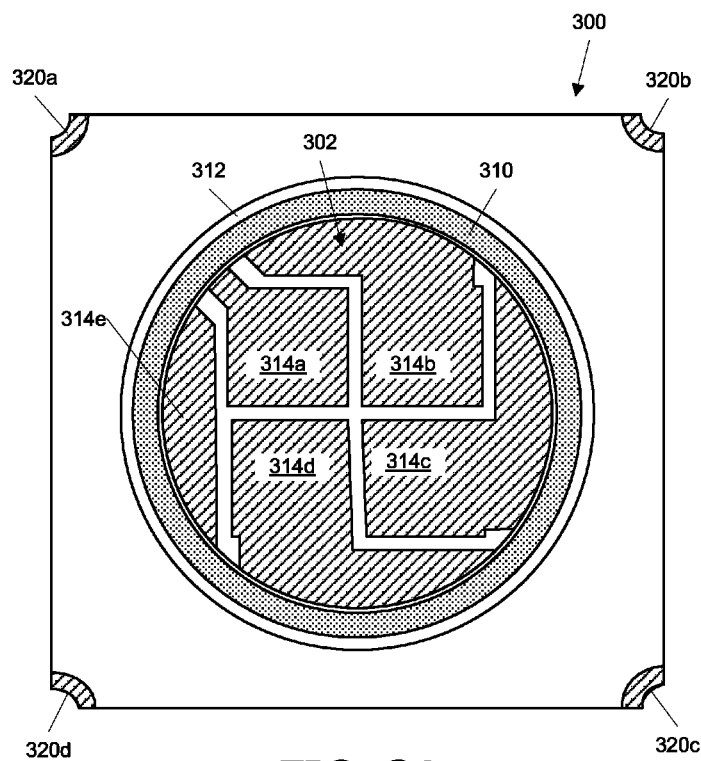
FIGS. 3A-3D illustrate a 4-LED package according to an embodiment of the present invention. More specifically.

FIG. 3A is a simplified top view of a substrate 300 for a 4-LED package according to an embodiment of the present invention. Substrate 300, viewed from the top, can be a square of any size desired, e.g., about 0.4-2 cm on a side; in one embodiment, the square is about 0.7 mm on a side. Its thickness can be, e.g., about 0.7-2 mm or other thickness as desired. Like substrate 200 of FIG. 2, substrate 300 is formed as a set of ceramic layers of different thicknesses. A recess 302 is defined by an angled sidewall 310 and surrounded by a ledge 312, similar to recess 210, sidewall 211, and ledge 212 of FIG. 2. Top-side metal bond pads 314a-e are disposed within the recess. In this embodiment, four peripheral bond pads 320a-d are provided for external electrical contacts. An LED (not shown) can be bonded to each top-side bond pad 314a-d and connected to another top-side bond pad, e.g., by a wire bond.

Depending on how the LEDs are connected and how top-side bond pads 314a-e are electrically coupled to peripheral bond pads 320a-d, a number of electrical configurations are possible.

Figure 3B:
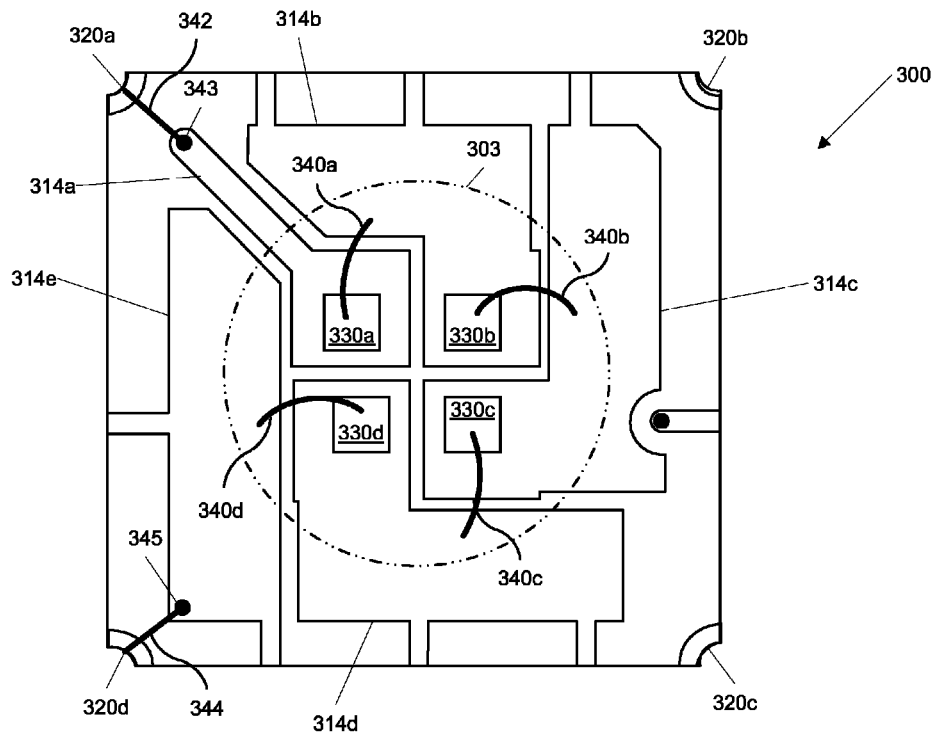

For example, FIG. 3B is a cutaway top view of substrate 300, with the upper layers forming sidewall 310 and ledge 312 (e.g., corresponding to upper layers 204 and 205 of FIG. 2) removed. The inner periphery of recess 302 is indicated by broken line 303. As can be seen, top-side bond pads 314a-e can extend outward beyond the boundary of recess 302, further spreading heat across more of the upper surface of the ceramic substrate 300.

FIG. 3B also shows how four LEDs 330a-d can be placed and electrically connected to substrate 300 according to an embodiment of the present invention. In this embodiment, each of LEDs 330a-d has an electrical contact on its bottom surface (not explicitly shown) and a top pad (also not explicitly shown) for a wire bond 340a-d. For purposes of illustration, an electrical connection between top-side bond pad 314a and peripheral bond pad 320a is represented by a line 342, and an electrical connection between LED bond pad 314e and peripheral bond pad 320d is represented by a line 344. It is to be understood that lines 342, 344 may be implemented as metal layers between ceramic layers, e.g., as shown in FIG. 2. For example, lines 342, 344 may be created on a layer below the layer seen in FIG. 3B and connected to pads 314a, 314e by vias 343, 345. The particular routing may be varied from that shown. In addition, in some embodiments, redundant connections may be provided; for example, pad 314a might also be connected to peripheral bond pad 320b, and pad 314e might also be connected to peripheral bond pad 320c.

Figure 3C:
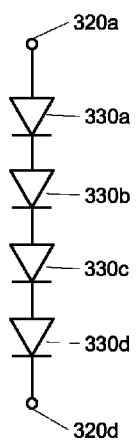

The pad configuration of FIG. 3B provides a serial connection among LEDs 330a-d. Specifically, peripheral bond pad 320a connects to top-side bond pad 314a, as indicated by line 342. LED 330a is connected between top-side bond pad 314a and top-side bond pad 314b by wire bond 340a. LED 330b is connected between top-side bond pad 314b and top-side bond pad 314c by wire bond 340b. LED 330c is connected between top-side bond pad 314c and top-side bond pad 314d by wire bond 340c. LED 330d is connected between top-side bond pad 314d and top-side bond pad 314e by wire bond 340d. Bond pad 314e is connected to peripheral bond pad 320d, as indicated by line 344. Thus, LEDs 330a-d are connected in series between peripheral bond pad 320a and peripheral bond pad 320d; this connection is also illustrated schematically in FIG. 3C. In this configuration, applying a potential difference between peripheral bond pad 320a and peripheral bond pad 320d will provide power to all four LEDs 330a-d.

Referring again to FIG. 3B, it should be noted that top-side bond pads 314a-e are advantageously made as large as possible and can be substantially larger than LEDs 330a-d. The large area of the bond pads allows heat generated by the LEDs to spread quickly across the upper surface of the ceramic substrate, increasing the amount of heat that can be transferred vertically through the substrate.

Figure 3D:
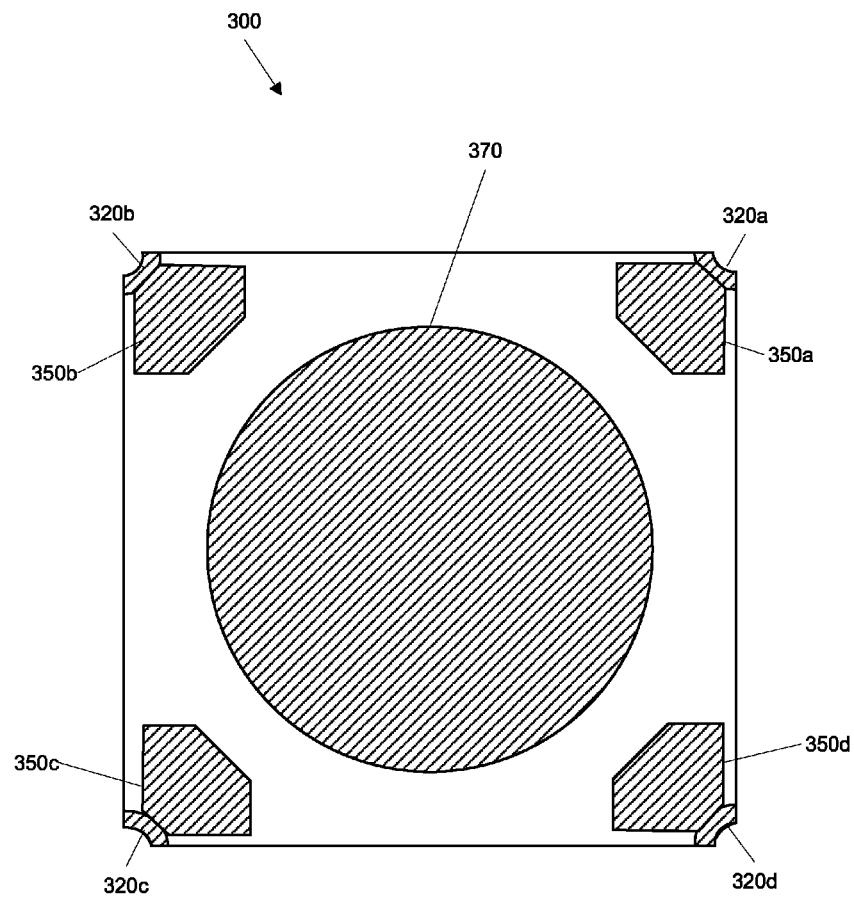

FIG. 3D is a bottom view of substrate 300 of FIG. 3A. A metal region 370, which is advantageously circular is centered relative to recess 302 (FIG. 3A). Metal region 370 acts as a heat dissipation plate. A heat sink can be placed in thermal contact with metal region 370 to further dissipate heat.

Peripheral bond pads 320a-d can extend along the entire vertical thickness of substrate 300 (similar to substrate 200 in FIG. 2) and can be connected to bottom pads 350a-d. External electrodes (e.g., wires) can be connected directly to peripheral bond pads 320a-d and/or to bottom pads 350a-d as desired.

It should be noted that metal region 370 is not electrically coupled to any of peripheral bond pads 320a-d; bottom pads 350a-d; or LED bond pads 314a-e. Thus, metal region 370, in conjunction with the thermally conductive ceramic body of substrate 300, provides a thermal path through substrate 200 that is separate from the electrical path.

It will be appreciated that the 4-LED package of FIGS. 3A-3D is illustrative and that variations and modifications are possible. For example, while in the embodiment shown, all four LEDs are connected in series, other configurations are possible; for instance two of the LEDs can be connected in series, while the other two LEDs are independently connected in series, thus providing two separate electrical connection paths and allowing current or voltage to each pair of LEDs to be separately controlled. In other embodiments, a separate electrical connection can be provided to each LED. In some embodiments, separate control of current or voltage to different subsets of the LEDs can be used to control output light color, e.g., as described below.

Figure 4A:
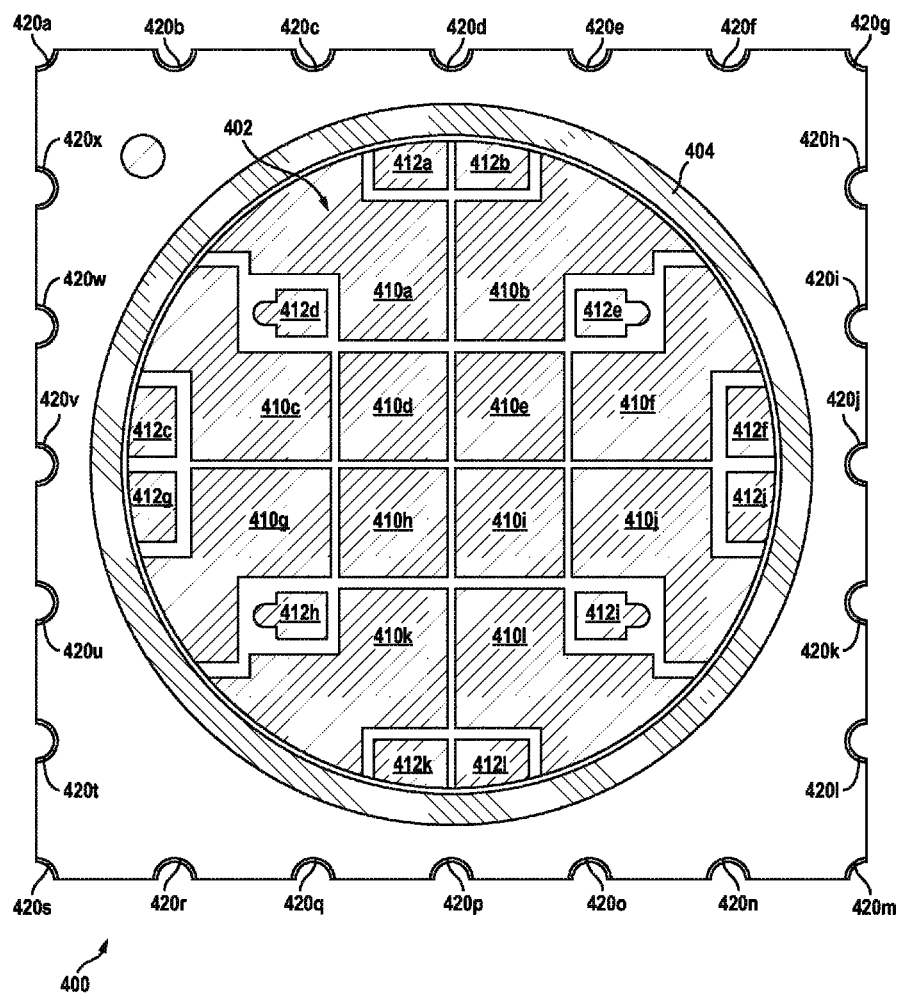

FIG. 4A is a simplified top view of a substrate 400 for a 12-LED package according to another embodiment of the present invention. Substrate 400, viewed from the top, can be a square of any size desired, e.g., about 0.7-5 cm on a side; in one embodiment, the square is bout 9 mm on a side. Its thickness can be, e.g., about 0.5-2 mm or other thickness as desired; in one embodiment, the thickness is between 0.7-1 mm. Like substrate 200 of FIG. 2, substrate 400 is formed as a set of ceramic layers. A recess 402 is defined by an angled sidewall 404 and optionally surrounded by a ledge (not explicitly shown), similar to recess 210 and ledge 212 of FIG. 2. Top-side bond pads, which include LED bond pads 410a-l, and wire bond pads 412a-l, are disposed within the recess. In this embodiment, twenty-four peripheral bond pads 420a-x are provided for external electrical contacts. Twelve LEDs (not shown in FIG. 4A) can be bonded to LED bond pads 410a-l, and connected, e.g., via wire bonds, to wire bond pads 412a-l, as shown in FIG. 4B and described below.

Depending on how the LEDs are connected and how top-side bond pads 410a-l, 412a-l, are electrically coupled to peripheral bond pads 420a-x, a number of electrical configurations are possible.

Figure 4B:
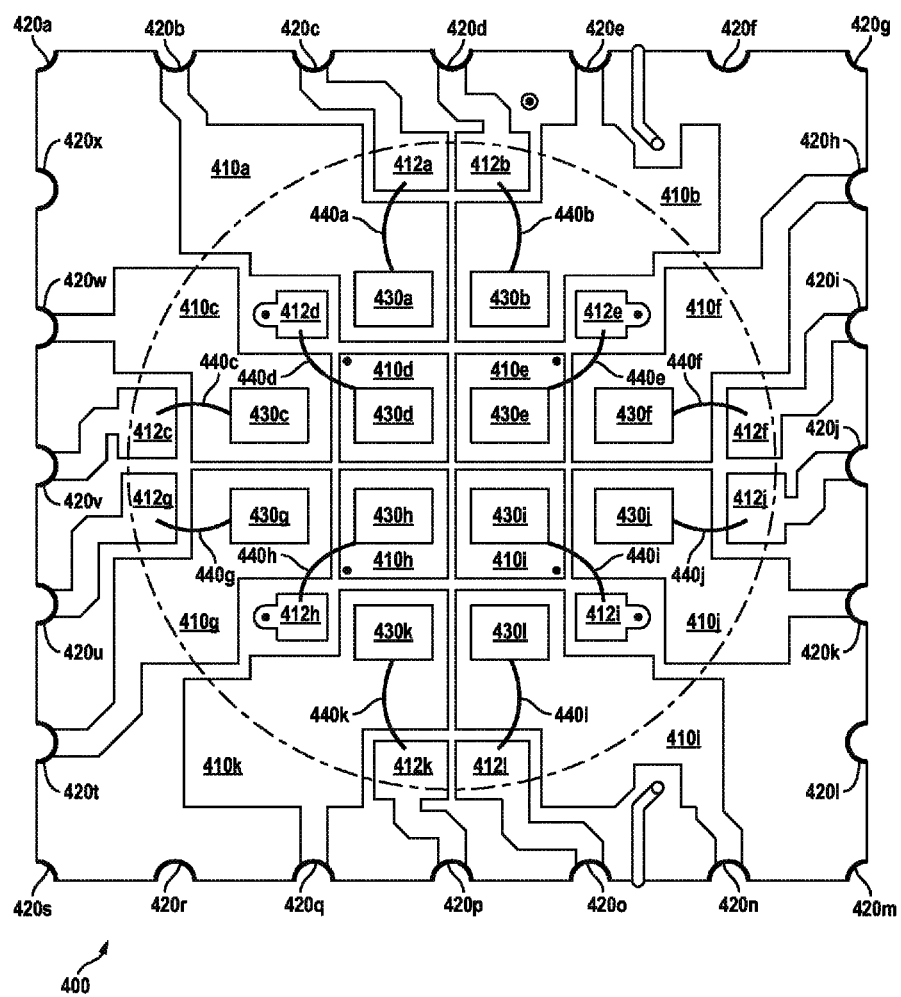

For example, FIG. 4B is a cutaway top view of substrate 400, with the upper layers forming sidewall 404 (e.g., corresponding to layers 204 and 205 of FIG. 2) removed. The inner periphery of recess 402 is indicated by broken line 403. As can be seen, some of top-side bond pads 410a-l, 412a-l, can extend outward beyond the boundary of recess 402, further spreading heat across more of the upper surface of ceramic substrate 400. In addition, some of top-side bond pads 410a-l, 412a-l, can connect to some of peripheral bond pads 420a-x without the use of vias or metal interconnects between other layers. Connections to the remaining bond pads are not explicitly shown in FIG. 4B; however, FIG. 4C is a table identifying which top-side bond pad(s) 410a-l, 412a-l, are connected to each peripheral bond pad 420a-x. It is to be understood that paths not shown in FIG. 4B may be implemented using vias and metal interconnect between the ceramic layers (e.g., as illustrated in FIG. 2). For example, metal interconnects may be created on a layer below the layer seen in FIG. 4B and connected to the various pads by vias.

FIG. 4B also shows how twelve LEDs 430a-l can be placed and electrically connected to substrate 400 according to an embodiment of the present invention. In this embodiment, each of LEDs 430a-l has an electrical contact on its bottom surface (not explicitly shown) and a top pad (also not explicitly shown) for a wire bond 440a-l.

The pad configuration of FIG. 4B can provide a separate, independently controllable, electrical connection path for each of the twelve LEDs 430a-l. (Herein, LEDs or groups of LEDs with a separate electrical connection path are referred to as being "independently addressable.") For example, peripheral bond pad 420b connects to LED bond pad 410a. LED 430a is connected between LED bond pad 410a and wire bond pad 412a by wire bond 440a. Wire bond pad 412a connects to peripheral bond pad 420c. Likewise, peripheral bond pad 420w connects to LED bond pad 410c. LED 430c is connected between bond pad 410c and bond pad 412c by wire bond 440c. Bond pad 412c is connected to peripheral bond pad 420v. Further, peripheral bond pad 420x connects to LED bond pad 410d (the connection is not explicitly shown). LED 430d is connected between LED bond pad 410d and wire bond pad 412d by wire bond 440d. Wire bond pad 440d connects to peripheral bond pad 420a (again, the connection is not explicitly shown). Similarly, each other LED 430 is electrically coupled between a different pair of peripheral bond pads.

Figure 4D:
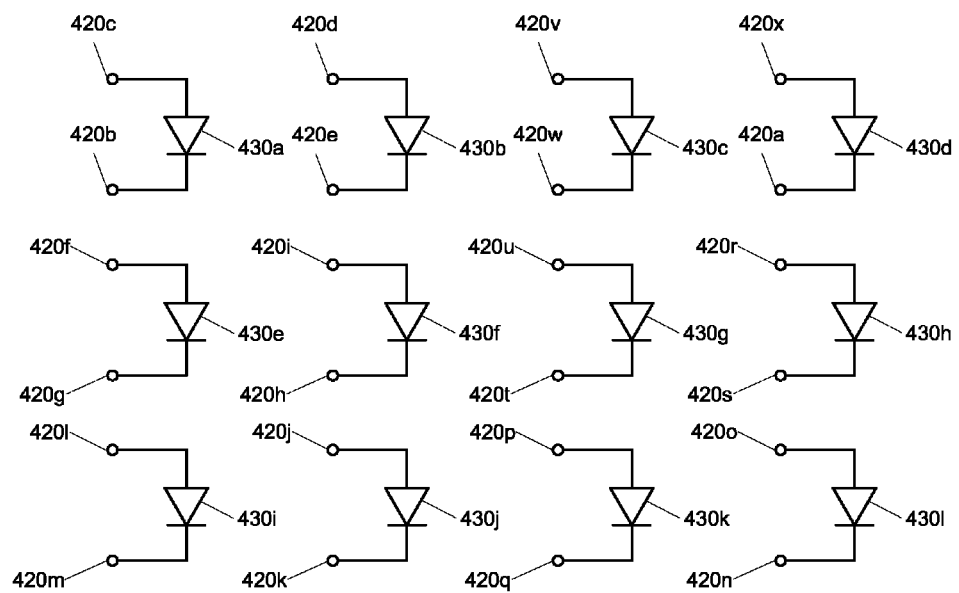
Figure 4E:
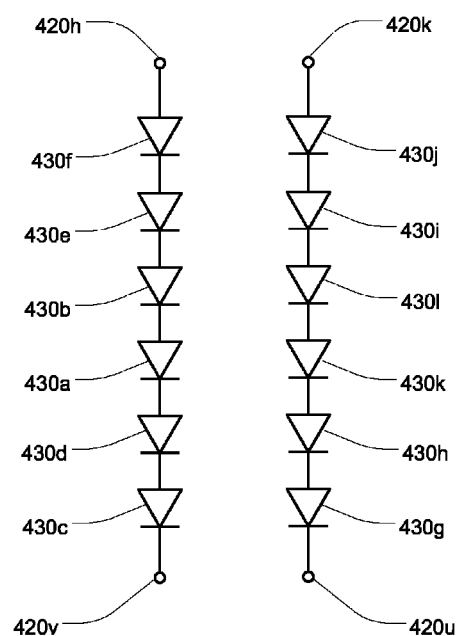

Thus, LEDs 430a-l are each individually addressable; this is also illustrated schematically in FIG. 4D. In this configuration, applying a potential difference across the appropriate pair of peripheral bond pads will provide power to one of the twelve LEDs 430a-l. The individually addressable connections to the LEDs provide flexibility to make connections outside of the package and thereby connect the LEDs together in different groups. For example, LEDs 430a-l could be connected into four groups of three LEDs each or two groups of six LEDs each. The LEDs within a group can be connected in series or in parallel as desired. For example, FIG. 4E is a schematic diagram illustrating a configuration with two groups of six LEDs 460 connected in series according to another embodiment of the present invention.

In still other embodiments, series or parallel connections of multiple LEDs can be "built in" to the substrate. For example, if a wire bond pad (e.g., pad 412d) were electrically connected to an LED bond pad (e.g., pad 410c), a serial connection would be permanently defined for LEDs 430c, 430d. Such a connection can be made directly between the pads, or indirectly using vias and metal interconnects between base layers of substrate 400.

Referring again to FIG. 4B, it should be noted that LED bond pads 410a-l, are advantageously made as large as possible and can be substantially larger than LEDs 430a-l. The large area of the LED bond pads allows heat generated by LEDs 430a-l, to spread quickly across the upper surface of the ceramic substrate, increasing the amount of heat that can be transferred vertically through the substrate.

Figure 4F:
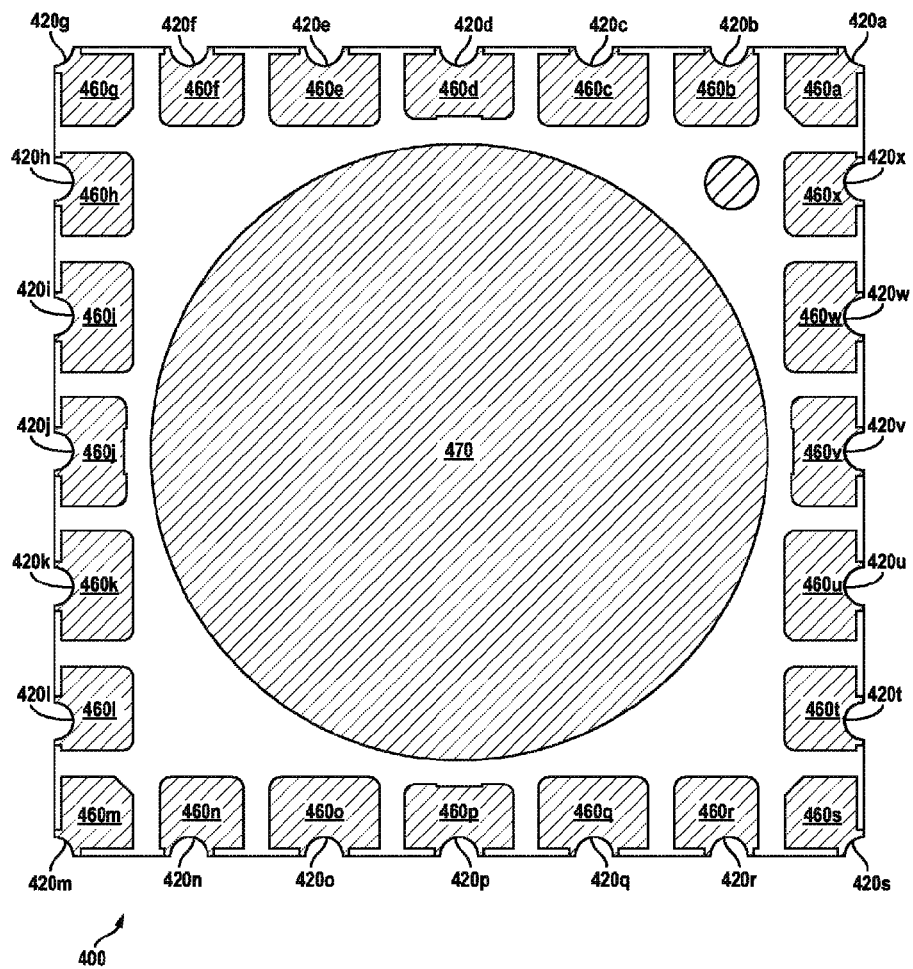

FIG. 4F is a bottom view of substrate 400 of FIG. 4A. A metal region 470, which is advantageously circular and as large as possible is centered relative to recess 402 (FIG. 4A). Metal region 470 acts as a heat dissipation plate. A heat sink can be placed in thermal contact with metal region 470 to further dissipate heat.

Peripheral bond pads 420a-x can extend along the entire vertical thickness of substrate 400 (similar to substrate 200 of FIG. 2) and can be connected to bottom pads 460a-x. External electrodes (e.g., wires) can be connected directly to peripheral bond pads 420a-x and/or to bottom pads 460a-x as desired.

It should be noted that metal region 470 is not electrically coupled to any of peripheral bond pads 420a-x, bottom pads 460a-x, or top-side bond pads 410a-l, 412a-l. Thus, metal region 470, in conjunction with the thermally conductive ceramic body of substrate 400, provides a thermal path that is separate from the electrical path.

Figure 5A:
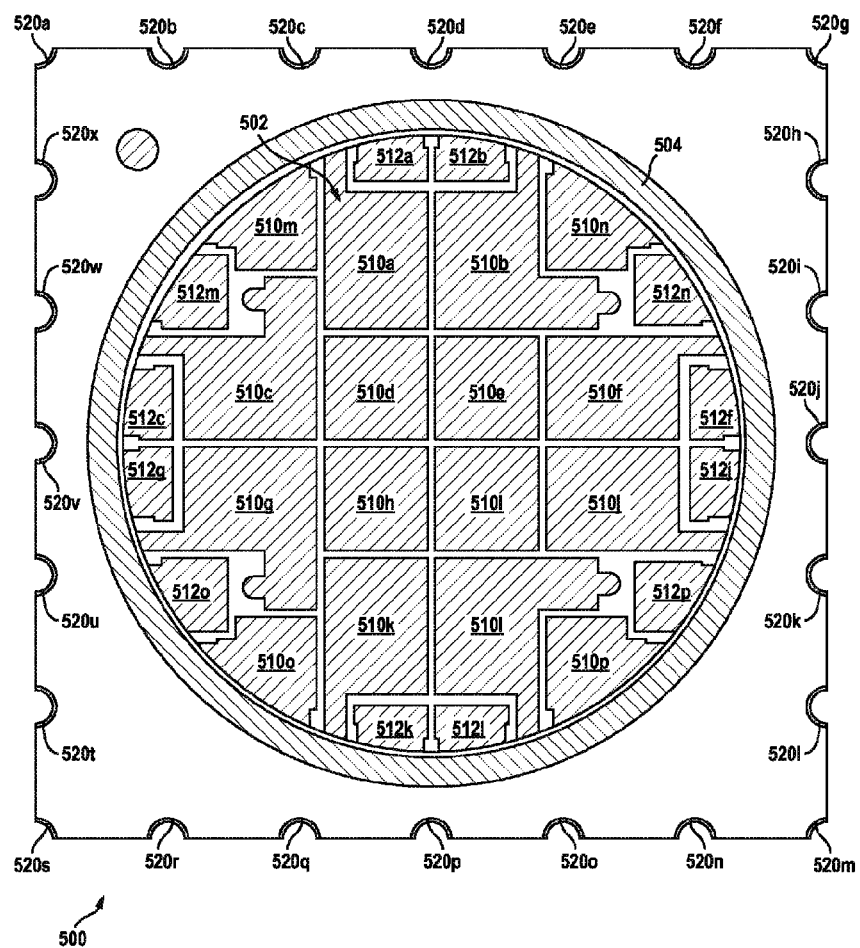

FIG. 5A is a simplified top view of a substrate 500 for a 16-LED package according to an embodiment of the present invention. Substrate 500, viewed from the top, can be a square of any size desired, e.g., about 0.7-5 cm on a side; in one embodiment, the square is about 0.9 cm on a side. Its thickness can be, e.g., about 0.7-2 mm or other thickness as desired. Like substrate 200 of FIG. 2, substrate 500 is formed as a set of ceramic layers. A recess 502 is defined by an angled sidewall 504 and can be surrounded by a ledge (not explicitly shown), similar to recess 210 and ledge 212 of FIG. 2. Twenty-eight top-side bond pads are disposed within recess 502, including sixteen LED bond pads 510a-p and twelve wire bond pads 512a-p. (It should be noted that the twelve wire bond pads are numbered 512a-c, 512f, 512g, and 512j-p; for brevity, they are denoted collectively as pads 512a-p.) In this embodiment, twenty-four peripheral bond pads 520a-x are provided for external electrical contacts. An LED (not shown in FIG. 5A) can be bonded to each bond pad 510a-p and connected to another bond pad 510 or 512 by bond wires.

Depending on how the LEDs are connected and how top-side bond pads 510a-p and 512a-p are electrically coupled to peripheral bond pads 520a-x, a number of electrical configurations are possible.

Figure 5B:
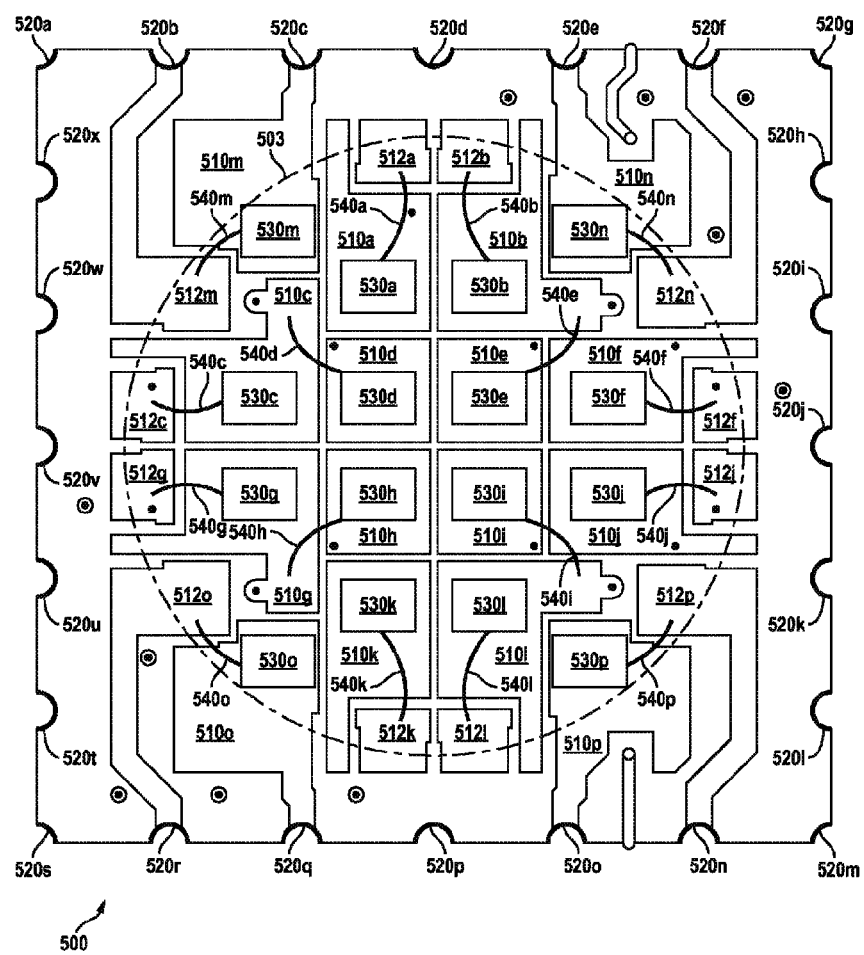

For example, FIG. 5B is a cutaway top view of substrate 500, with the upper layers forming sidewall 504 (e.g., corresponding to layers 204 and 205 of FIG. 2) removed. The inner periphery of recess 502 is indicated by broken line 503. Sixteen LEDs 530a-p are placed on and electrically connected to bond pads 510a-p, 512a-p as shown. As can be seen, some of top-side bond pads 510a-p and 512a-p can extend outward beyond the boundary of recess 502, further spreading heat across more of the upper surface of the ceramic substrate 500. In some embodiments, LED bond pads 510a-p are advantageously made as large as possible and can be substantially larger than LEDs 530a-p. The large area of the bond pads allows heat generated by the LEDs to spread quickly across the upper surface of the ceramic substrate, increasing the amount of heat that can be transferred vertically through the substrate.

In the embodiment of FIG. 5B, each LED 530a-p is connected between an LED bond pad 510a-p and another bond pad. In particular, each LED 530a-p has an electrical contact on its bottom surface (not explicitly shown) and a top pad (also not explicitly shown) for a wire bond 540a-p.

In the configuration of FIGS. 5A and 5B, there are sixteen LED bond pads 510a-p and sixteen wire bond pads 512a-p but only 24 peripheral bond pads 520a-x. With this particular configuration, each LED would not be independently addressable, although various subsets of the sixteen LEDs can be addressable independently of each other, For example, in one embodiment, LEDs 530a-530f are connected in series between peripheral bond pads 520w and 520h, while LEDs 530g-530l are connected in series between peripheral bond pads 520t and 520k, thus forming two independently addressable groups of LEDs. The remaining four LEDs 530m-p can each be independently addressable.

More specifically, peripheral bond pad 520h can be connected (e.g., by vias and interconnects as shown in FIG. 2) to LED bond pad 510f. LED 530f is connected between LED bond pad 510f and wire bond pad 512f by wire bond 540f. Wire bond pad 512f can be connected (e.g., by vias and interconnects) to LED bond pad 510e. LED 530e is connected between LED bond pad 510e and LED bond pad 510b by wire bond 540e. LED 530b is connected between LED bond pad 510b and wire bond pad 512b by wire bond 540b. Wire bond pad 512b can be connected (e.g., by vias and interconnects) to LED bond pad 510a. LED 530a is connected between LED bond pad 510a and wire bond pad 512a by wire bond 540a.

Wire bond pad 512a can be connected (e.g., by vias and interconnects) to LED bond pad 510d. LED 530d is connected between LED bond pad 510d and LED bond pad 510c by wire bond 540d. LED 530c is connected between LED bond pad 510c and wire bond pad 512c by wire bond 540c. Wire bond pad 512c can be connected (e.g., by vias and interconnects) to peripheral bond pad 520w. In some embodiments, redundant electrical connections to a second peripheral bond pad can be provided. For example, LED bond pad 510f can be connected to peripheral bond pad 520i in addition to peripheral bond pad 520h. Likewise, wire bond pad 512c can be connected to peripheral bond pad 520x in addition to peripheral bond pad 520w.

Similarly, peripheral bond pad 520k can be connected (e.g., by vias and interconnects in a as shown in FIG. 2) to LED bond pad 510j. LED 530j is connected between LED bond pad 510j and wire bond pad 512j by wire bond 540j. Wire bond pad 512j can be connected (e.g., by vias and interconnects) to LED bond pad 510i. LED 530i is connected between LED bond pad 510i and LED bond pad 510l, by wire bond 540i. LED 530l, is connected between LED bond pad 510l and wire bond pad 512l by wire bond 540l. Wire bond pad 512l can be connected (e.g., by vias and interconnects) to LED bond pad 510k. LED 530k is connected between LED bond pad 510k and wire bond pad 512k by wire bond 540k. Wire bond pad 512k can be connected (e.g., by vias and interconnects) to LED bond pad 510h. LED 530h is connected between LED bond pad 510h and LED bond pad 510g by wire bond 540h. LED 530g is connected between LED bond pad 510g and wire bond pad 512g by wire bond 540g. Wire bond pad 512g can be connected (e.g., by vias and interconnects) to peripheral bond pad 520t. In some embodiments, redundant electrical connections to a second peripheral bond pad can be provided. For example, LED bond pad 510j can be connected to peripheral bond pad 520l, in addition to peripheral bond pad 520k. Likewise, wire bond pad 512g can be connected to peripheral bond pad 520u in addition to peripheral bond pad 520t.

Thus, in one embodiment, LEDs 530a-l, are electrically connected into two independently-addressable series of six LEDs each. It is to be understood that connections described above but not shown in FIG. 5B may be implemented using vias and metal interconnect between the ceramic layers (e.g., as illustrated in FIG. 2). For example, metal interconnects may be created on a layer below the layer seen in FIG. 5B and connected to the various pads by vias.

The remaining four LEDs 530m-p can each be individually addressable. For example, peripheral bond pad 520c can be connected to LED bond pad 510m as shown. LED 530m is connected between LED bond pad 510m and wire bond pad 512m by wire bond 540m. Wire bond pad 512m is connected to peripheral bond pad 520b as shown. Likewise, peripheral bond pad 520e can be connected to LED bond pad 510n as shown. LED 530n is connected between LED bond pad 510n and wire bond pad 512n by wire bond 540n. Wire bond pad 512n is connected to peripheral bond pad 520f as shown. Peripheral bond pad 520q can be connected to LED bond pad 510o as shown. LED 530o is connected between LED bond pad 510o and wire bond pad 512o by wire bond 540o. Wire bond pad 512o is connected to peripheral bond pad 520r as shown. Peripheral bond pad 520o can be connected to LED bond pad 510p as shown. LED 530p is connected between LED bond pad 510p and wire bond pad 512p by wire bond 540p. Wire bond pad 512p is connected to peripheral bond pad 520n as shown.

FIG. 5C is a table identifying which top-side bond pad(s) 510a-p, 512a-p are connected to each peripheral bond pad 520a-x. It should be noted that in this embodiment, the peripheral bond pads at the four corners (pads 520a, 520g, 520m, 520s) have no electrical connections, and likewise the peripheral bond pads at the midpoints of each side (pads 520d, 520j, 520p, 520v) have no electrical connections. This design choice can improve reliability if the manufacturing process is more likely to result in defects at the corners and/or midpoints. Other choices may also be made.

Figure 5D:
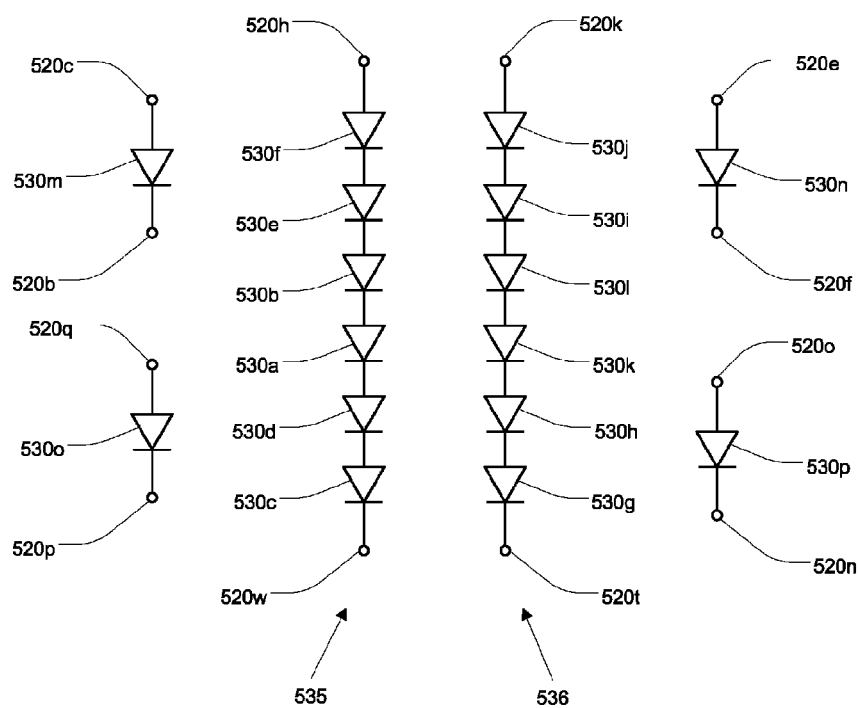

FIG. 5D is a schematic diagram showing electrical connectivity for the embodiment described above, with LEDs 530a-f belonging to one serially-connected group 535 and LEDs 530g-j belonging to a different serially connected group 536. Groups 535 and 536 are independently addressable, with group 535 being controlled by applying power between peripheral bond pads 520h and 520w and group 536 being controlled by applying power between peripheral bond pads 520k and 520t. In addition, each of LEDs 530m-p is individually addressable as indicated.

Those skilled in the art will appreciate that the particular connectivity shown and described herein is illustrative and that other embodiments are possible. For instance, the LEDs could be connected into four independently addressable groups of four LEDs each, two groups of four and four groups of two, or any other arrangement.

Further, in the particular embodiment shown, there are sixteen LED bond pads 510a-p and twelve wire bond pads 512a-p but only 24 peripheral bond pads 520a-x. With this particular configuration, each LED would not be independently addressable, although various subsets of the sixteen LEDs can be addressable independently of each other, as shown in FIG. 5D. However, those skilled in the art will appreciate that other embodiments are possible, including embodiments with a larger number of peripheral bond pads or other external electrical contacts. Thus, any number of LEDs can be made independently addressable by providing a sufficient number of electrically isolated connection pads.

In one embodiment, some of top-side bond pads 510a-p, 512a-p can be used to connect to light sensors rather than light emitters. For example, in FIG. 5B, a first light sensor can be connected between bond pads 510m and 512m (in place of LED 530m); a second light sensor can be connected between bond pads 510n and 512n (in place of LED 530n); a third light sensor can be connected between bond pads 510o and 520o (in place of LED 530o); and a fourth light sensor can be connected between bond pads 510p and 512p (in place of LED 530p). The appropriate peripheral bond pads (e.g., as listed in FIG. 5C) can then be used to sense a signal from the respective light sensors. Such signals can be used for dynamic feedback and control of the light output of a light device.

Figure 5E:
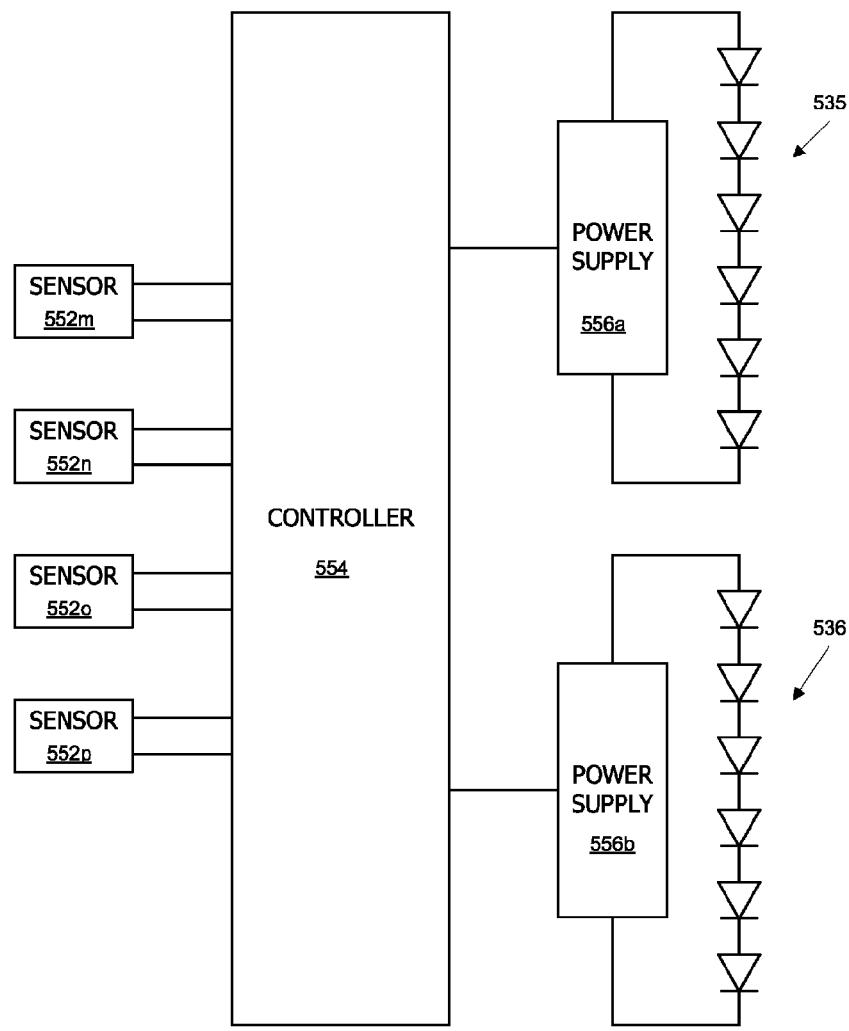

FIG. 5E is a simplified block diagram of a dynamic feedback and control system 550 for producing a desired quality of light according to an embodiment of the invention The combination of serial and individually addressable connections enables dynamic control of light emitting devices. In this embodiment, four light sensors 552m-p (replacing LEDs 530m-p of FIG. 5B) are connected to a controller 554, e.g., by coupling controller 554 to the appropriate bond pads of substrate 500 of FIGS. 5A-5B. Controller 554 controls two power supplies 556a-b. Power supply 556a delivers power to one group 535 of serially connected LEDs (e.g., as illustrated in FIG. 5D) while power supply 556b delivers power to a different group 536 of serially connected LEDs (e.g., as illustrated in FIG. 5D). In operation, light sensors 552m-p produce signals measuring characteristics of the aggregate light generated by the LEDs of groups 535, 536. Controller 554 can apply a signal to sensors 552m-p and detect a responsive signal. Based on signals received from light sensors 552m-p, controller 554 can control power supplies 556a-b, which supply power to groups of LEDs 535, 536.

Thus, for example, groups 535 and 536 can consist of white LEDs that produce light in different regions of the color temperature space for white light; e.g., LEDs in group 535 can produce "warm" white light while LEDs in group 536 produce "cool" white light. Controller 554 can adjust the color temperature of the overall light by changing the relative current supplied to the two groups 535 and 536. Since higher current increases brightness, the overall color temperature will depend on the relative currents supplied to the two groups of LEDs. Certain implementations that exploit independently addressable groups of LEDs to control light color are described in above-referenced U.S. patent application Ser. No. 12/420,800; however, the present invention is not limited to any particular implementation or application of independently addressable LEDs.

In another embodiment, the LEDs can be connected in any number of independently addressable groups, with each group of one or more LEDs producing light of a different color. For example, four groups could be used, with one group each for red, green, blue and amber LEDs. The color of the resulting light can be modified by changing the relative current supplied to each LED or group of like-color LEDs. Thus, for example, in a theatrical spotlight, the color could be changed simply by instructing controller 554 to create a different desired color.

Figure 5F:
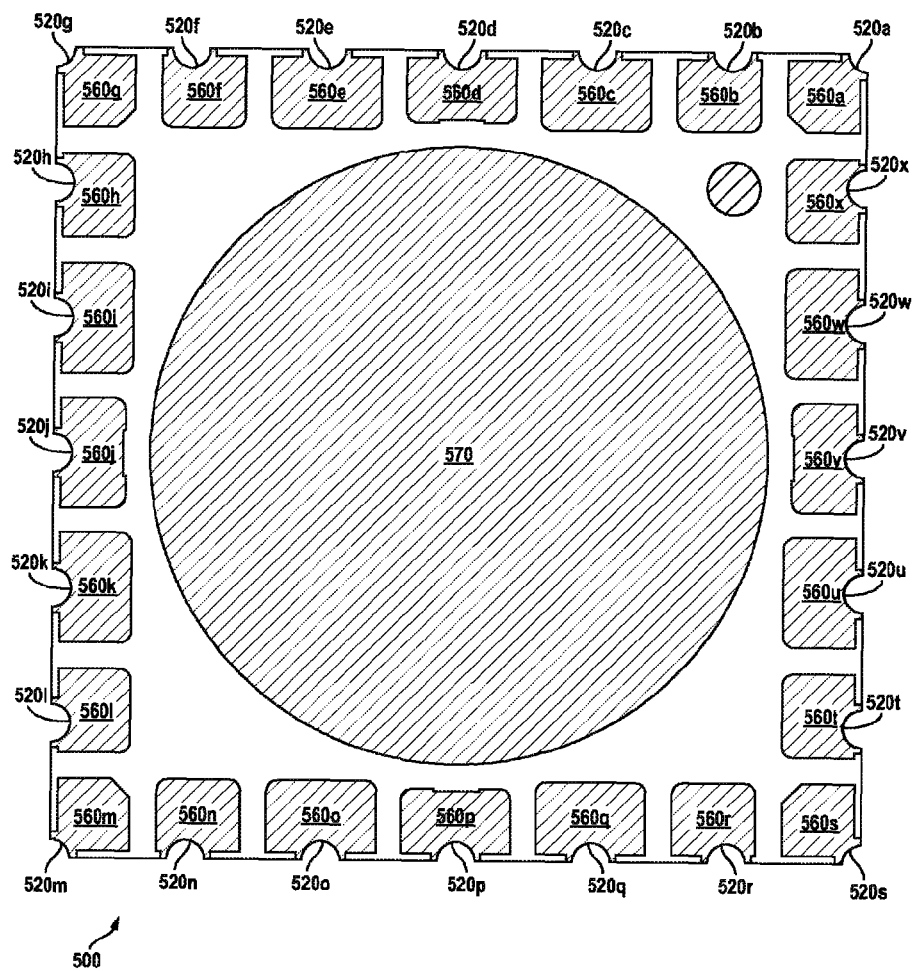

FIG. 5F is a bottom view of substrate 500 of FIG. 5A. A metal region 570, which is advantageously circular (other shapes can also be used) and as large as possible is centered relative to recess 502. Metal region 570 acts as a heat dissipation plate. A heat sink can be placed in thermal contact with metal region 570 to further dissipate heat.

Peripheral bond pads 520a-x can extend along the entire vertical thickness of substrate 500 (as shown for substrate 200 in FIG. 2) and can be connected to bottom pads 560a-x. External electrodes (e.g., wires) can be connected directly to peripheral bond pads 520a-x and/or to bottom pads 560a-x as desired.

It should be noted that metal region 570 is not electrically coupled to any of peripheral bond pads 520a-x; bottom pads 560a-x; or top-side bond pads 510a-p, 512a-p. Thus, metal region 570, in conjunction with the thermally conductive ceramic body of substrate 500, provides a thermal path that is separate from the electrical path.

It will be appreciated that the various substrates described herein are illustrative and that variations and modifications are possible. For instance, the LEDs can be individually addressable, or groups of LEDs can be addressable together (e.g., two groups consisting of six LEDs each in the 12-LED package or 16-LED package described above). Independent addressability can permit greater control over the output light, e.g., as illustrated above with reference to FIG. 5E. For example, in an embodiment where different LEDs on the substrate produce light of different colors (e.g., red, blue, green, and amber), the color of the resulting light can be modified by changing the relative current supplied to each LED. Since higher current increases brightness, the light color will depend on the relative currents.

In another embodiment, white LEDs (e.g., a blue LED combined with yellow phosphor) can be separated into "warm" and "cool" LEDs based on the color temperature of the white light produced, which can vary widely as is known in the art. If the LEDs in each group are addressable independently of the other, the final color can be controlled by controlling the relative current supplied to each group. Examples of lighting apparatus incorporating warm white and cool white LEDs with controls for adjusting relative brightness are described in above-referenced application Ser. No. 12/420,800; it is to be understood that the present invention is not limited to any particular arrangement or type of LEDs or to any particular control system. For example, some control systems might provide manual adjustment during manufacturing and/or operation of a lighting apparatus (e.g., a lamp), and automated dynamic adjustment might or might not be incorporated.

In the embodiments described above, the ceramic material of the substrates is thermally conductive. Accordingly, the substrate will transfer heat from the LEDs to the bottom surface of the substrate as long as the temperature of the bottom surface of the substrate is lower than the temperature of the LEDs. This condition can be maintained during device operation, e.g., using a heat sink, fan, and/or other cooling technology. The large area of the LED bond pads, which are advantageously made of metals (which are thermally as well as electronically conductive), can help to spread heat quickly across the upper surface of the substrate layer on which the LEDs are placed. Spreading the heat across a larger area increases the thermal transfer performance of the ceramic substrate and also reduces mechanical stress on the substrate due to temperature differences in the lateral direction.

Further, the pad structure and metal traces and vias used to provide electrical connections to the LEDs serve to separate the thermal transfer path from the electrical transfer path. (While the metal will conduct heat, the substrate design does not rely entirely on metal for a thermal transfer path; the bulk of the substrate is ceramic, which is electrically insulating but thermally conductive.) In particular, the large heat dissipation pad on the bottom surface of the substrate is electrically isolated from the LEDs. This allows great flexibility in the design of the LED connections, for instance, allowing an LED or group of LEDs to be individually addressable, while still providing for efficient thermal transfer away from the bottom surface of the substrate.

This combination of features can also provide a significant advantage in thermal management. One figure of merit for thermal properties of an LED substrate is thermal conductivity between the junction (i.e., the LED) and the case (i.e., the bottom of the substrate), denoted $\theta_{JC}$ and measured in degrees Celsius per Watt (° C./W), reflecting the temperature difference that develops across this distance. In one embodiment, a substrate for a 16-LED package has $\theta_{JC}$ of about 1° C./W, as compared to conventional substrates of similar size, where $\theta_{JC}$ is typically in the range of 7-15° C./W. This is significant, as high $\theta_{JC}$ can limit the power (and therefore brightness) of an LED. For example, at $\theta_{JC}$=7° C./W, an LED (or group of LEDs on the same substrate) operating at 30 W would result in a junction-to-case temperature difference of 210° C.; at room temperature, the device would exceed the maximum operating temperature of existing LEDs, resulting in device failure. In contrast, with $\theta_{JC}$=1° C./W, an LED operating at 30 W results in a junction-to-case temperature difference of only 30° C.; at room temperature (about 20° C.), existing LEDs can remain within their specified operating range. Thus, embodiments of the present invention allow LEDs to operate at higher power (and therefore higher brightness) than has previously been feasible in a compact package.

It should be noted, however, that even with significantly reduced $\theta_{JC}$, the package will still experience thermal stress under intended operating conditions. Materials, thicknesses, and layouts of metal layers are advantageously selected so as to reduce stress and prevent warping, cracking, or delamination.

Figure 6:
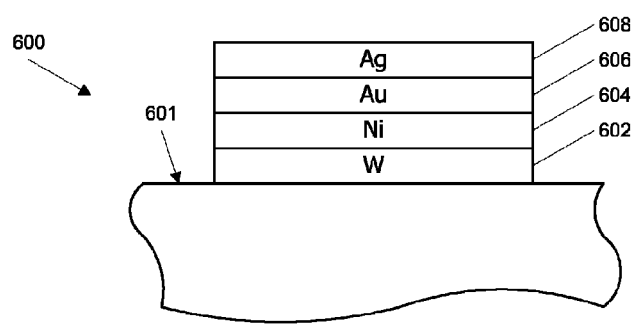
FIG. 6 is a simplified block diagram showing a metal layer formed on a ceramic surface according to an embodiment of the present invention.

For example, in some embodiments, each metal pad and interconnect is formed by sequentially depositing "sub-layers" of different metals on the ceramic layer. FIG. 6 is a simplified block diagram showing a metal layer 600 formed on a ceramic surface 601 (e.g., a layer of any of the substrates shown above) according to an embodiment of the present invention. In this embodiment, metal layer 600 consists of a tungsten (W) sub-layer 602, a nickel (Ni) sub-layer 604, a gold (Au) sub-layer 606, and a silver (Ag) sub-layer 608, deposited in that order. These sub-layers can each be from a few angstroms up to 100 nm or more in thickness, and different sub-layers can have different thicknesses. In one example, the W sub-layer is in the approximate range 1.5-4.5 μm (e.g., about 3.0 μm), the Ni sub-layer in the approximate range 1.2-8.9 μm (e.g., about 3.0 μm), the Au sub-layer in the approximate range 0.2-0.35 μm (e.g., about 0.3 μm), and the Ag sub-layer in the approximate range 2.0-4.5 μm (e.g., about 4.0 μm). In some embodiments, the silver sub-layer is only used for the top-side bond pads, to increase the reflectivity of the floor of the recess. The bottom pads and heat dissipation plate may be made of a single layer of tungsten. Vias and peripheral bond pads can also be made of a single metal, e.g., tungsten, or a combination of metals as described above.

In some embodiment, as described above, metal interconnects are provided between some or all of ceramic layers. In addition to these interconnects, the pattern of metal that is deposited may include "dummy structures," a term that refers generally to any metal pads, lines or other structures that are not electrically connected to anything else. Such dummy structures can be made from the same sub-layers as the active metal areas (pads, interconnects, etc.). Use of dummy structures may reduce or distribute thermal stress more evenly across the ceramic surface.

Figure 7:
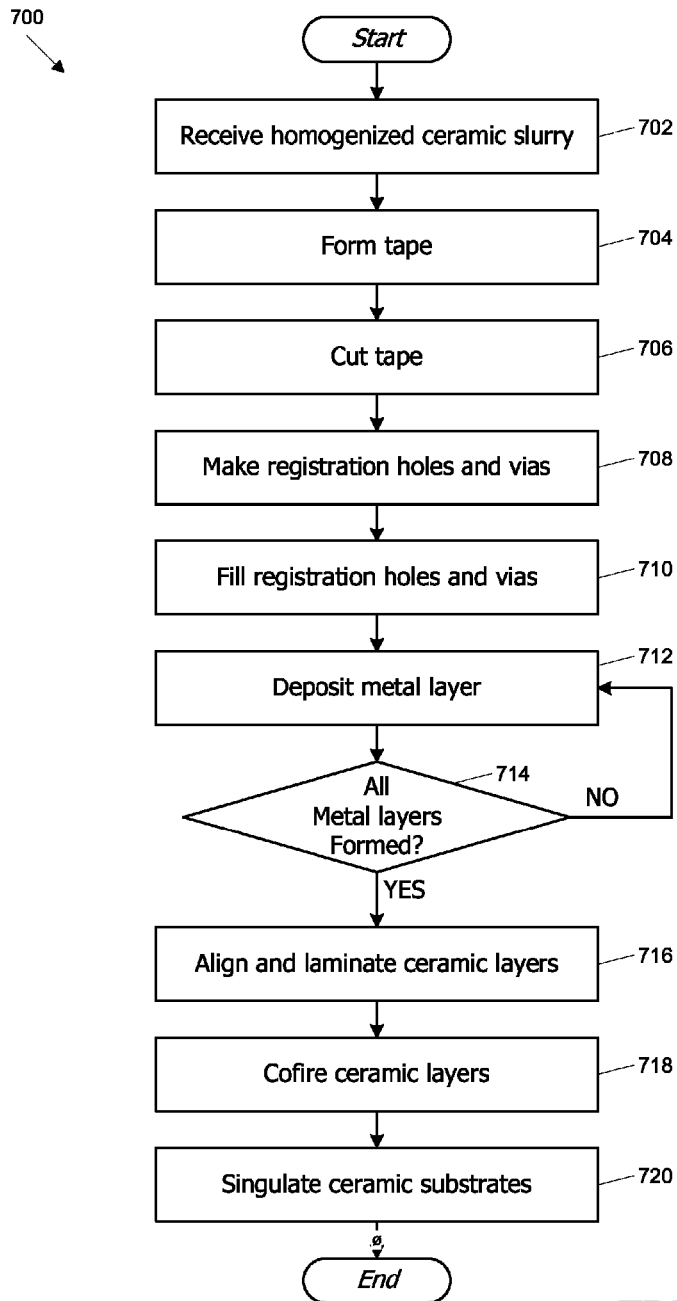
FIG. 7 is a simplified flowchart of a process for fabricating ceramic substrates for LED packages according to an embodiment of the present invention.

FIG. 7 is a simplified flowchart of a process 700 for fabricating ceramic substrates for LED packages according to an embodiment of the present invention. At step 702, a homogenized ceramic slurry that will be used to form the ceramic layers is obtained. For example, the slurry may include ceramic particles (e.g., in powder form) dispersed in a solvent (normally liquid). The slurry may also include other additives such as binding agents to interconnect the ceramic particles, plasticizer to dissolve organic compounds, dispersants, wetting agents, defoamers, homogenizers, preservatives, flow control agents, and deflocculants. The slurry may be obtained, e.g., by acquiring it from a third party or by acquiring ingredients and creating the slurry.

At step 704, a "tape" is formed from the ceramic slurry. For example, the slurry can be cast onto a moving carrier surface that has been coated with a smooth "non-stick" film such as plastic or poly(tetrafluoroethylene). A blade spreads the slurry onto the carrier film at a specified thickness, resulting in a smooth tape. The thickness of the sheets can be controlled to produce substrates of different thicknesses (e.g., for the different layers as shown in FIG. 2). Heating elements (e.g., heat lamps) evaporate the solvent. When dry, the ceramic tape is removed from the carrier film.

At step 706, the tape is cut into discrete units, for example, rectangular or square in shape. At step 708, pad indentations (registrations) along the side of the substrate and vias in the interior of the substrate are formed, by mechanical punching, drilling, laser cutting, photolithography, or other techniques. In the case of the upper layers (e.g., layers 204 and 205 in FIG. 2), larger openings may be formed to define recess sidewalls and ledges. The pattern of registrations, vias and other openings is determined based on the desired layout. Depending on the size of the tape, multiple copies of the pattern may be formed in different areas of the tape.

At step 710, the registrations and vias can be filled, e.g., with a homogenized ink or paste comprised of metal powder, or with a series of different metals (e.g., Cu, W, Ni, Au, Ag), each of which can be applied as an ink or paste. At step 712, a first one of the metal sub-layers of FIG. 6 is formed by plating the ceramic substrate with a metal, for example, using screen printing techniques. In one embodiment, a homogenized ink or paste containing the appropriate metal powder (e.g., W, Ni, Au, or Ag) is printed or patterned through a screen on top of the substrate. The thickness of the print can be controlled for each metal, and one or both sides of the substrate can be plated. As indicated at step 714, the plating process can be repeated for each metal sub-layer to form the metal stack of FIG. 6. The same screen (pattern) can be used for each metal. Other processes such as photoimageable thick-film processing or diffusion patterning may be used to plate the ceramic substrate with the successive sub-layers of metal.

At step 716, the sheets corresponding to the different ceramic layers of the substrate (e.g., as shown in FIG. 2) are aligned and laminated (pressed together at high temperature). In one embodiment, step 716 can start with a precondition bake where the individual sheets are baked, e.g., at around 50° C. for about 20-30 minutes. In the lamination process, the sheets are stacked together and pressed, for example at a pressure of around 2000 psi and a temperature around 70° C. for about 10 minutes. Other baking and laminating times, temperatures, and pressures may be used, for example depending upon thickness of the stack.

At step 718, the laminated sheets are cofired. One cofiring process involves two baking stages with controlled ramps. In the first stage, the sheets can be baked for about 2 hours at around 400° C.-500° C.; a temperature ramp of about 1° C. per minute can be used to warm up (e.g., from approximately room temperature) to baking temperature and cool down again (e.g., to approximately room temperature) after the baking time. In the second stage, the sheets can be baked for about 30 minutes at around 850° C.; a temperature ramp of 5° C. per minute can be used to warm up to baking temperature and cool down again after the banking time. It will be appreciated that the cofiring process herein is illustrative and that variations and modifications are possible. For instance, other times, temperatures, temperature ramps, and pressures may be used, depending, e.g., upon stack thickness; in some processes, a ramp-down to room temperature might not occur between baking stages.

At step 720, individual substrates are singulated by sectioning the laminated sheet, e.g., using a dicing saw, ultrasonic cutting tool, laser cutting tool, or the like.

After the substrate has been fabricated, LEDs can be bonded to the pads on the topmost base layer. Any type of LED can be used, and a mixture of LED types (e.g., different colors) can be bonded to the same substrate. In some embodiments, the LEDs may have one contact pad on top and another on bottom; in other embodiments, both contact pads can be on top. In either case, conventional surface mounting and/or wire bonding techniques can be used. The recess containing the LEDs can be filled with an optically transparent material (e.g., silicone) and covered with a primary lens.

Figure 8:
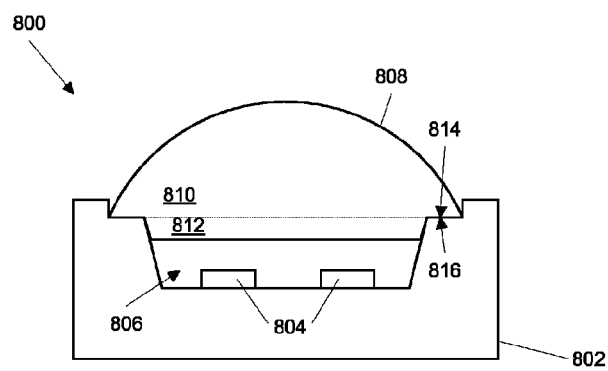
FIG. 8 is a simplified cutaway side view of an assembled LED package according to an embodiment of the invention.

FIG. 8 is a simplified cutaway side view of an assembled LED package 800 according to an embodiment of the invention. Substrate 802 can be a multilayer ceramic-and-metal structure, e.g., as described above. Any number of LEDs 804 can be bonded to the bond pads (not explicitly shown). Recess region 806 can be filled with silicone or other optically transparent media, and primary lens 808 is placed over the top. In one embodiment, the optically transparent medium in region 806 has an index of refraction that closely matches that of primary lens 808, to reduce light loss at the interface. The optically transparent medium can also have adhesive properties to hold primary lens 808 in position.

Primary lens 808 can be made of glass, silicone or other optically transparent material that is suitably resistant to high temperature. Materials with graded refractive index can also be used. As shown in FIG. 8, primary lens 808 can have a "muffin" cross section (other shapes can also be used), with a rounded top portion 810 and a tapered bottom portion 812 with a smaller diameter than top portion 810, thus creating a peripheral support surface 814. Bottom portion 812 is advantageously tapered to match the sidewall of recess region 806 and to extend partway down into recess region 806, leaving a gap between the bottom of lens 808 and the top of LEDs 804. Support surface 814 rests on a ledge 816 surrounding recess region 806 (see, e.g., ledge 212 of FIG. 2). Ledge 816 and support surface 814 can serve as registration features to properly align primary lens 808 with respect to LEDs 804. In addition, in some embodiments, bottom portion 812 of lens 808 can force air out of the optically transparent medium as it is pushed into recess region 806, reducing air bubbles that can lead to light loss and/or cracking of the package (e.g., during reflow when external electrical connections are being made to the package). Other primary lenses can also be used.

A secondary lens (e.g., lens 110 as shown in FIG. 1) can also be attached over the top of package 800. In some embodiments, some or all of the peripheral bond pads of substrate 802 can be used to provide registration features for aligning the secondary lens with primary lens 808; in other embodiments, substrate 802 may include other registration features (e.g., grooves, notches, indentations, bumps, holes, etc.) to aid in alignment of the secondary lens. Heat sinks, fans, electrical connections, housing, and the like can also be added to complete the fabrication of a lamp.

While the invention has been described with respect to specific embodiments, one skilled in the art will recognize that numerous modifications are possible. For instance, the number of LEDs and electrical connectivity thereof provided for on a substrate can be varied as desired. Thus, in various embodiments, each LED might be independently addressable, or groups of LEDs can be connected together and addressed as a unit. Thermal transfer is advantageously provided by the substrate itself, independently of the electrical connectivity.

Any type(s) of LED (broadly understood as any semiconductor device that emits light when a current is applied) can be used, including but not limited to conventional red, green, blue, amber, infrared, and ultraviolet LEDs. Further, different types of LEDs can coexist on the same substrate. Wavelength-shifting material (e.g., phosphor-containing material) may be applied to the surface of the LED, incorporated into the recess, or omitted entirely as desired. In addition, light sensors may be incorporated in place of some of the LEDs, and such light sensors might be used to provide feedback for adjusting the light output using automatic or manual control systems. Thus, any type of solid-state light device (including light emitters, light sensors, and/or any combination thereof) can be used in connection with practicing the present invention.

Further, the materials, processes, and tools described herein are also merely examples and can be varied. For example, the particular metal sub-layers herein can be replaced or augmented with other electrically conductive materials, and more or fewer sub-layers could be used. Different processing techniques can be employed. In addition, all dimensions stated herein are for purposes of illustration and can be varied as desired.

The overall form factor of substrates or packages may be varied from the examples shown herein. Packages can be larger or smaller and need not be square in area; rectangular, circular, or other shapes can be substituted. Substrate thickness can also be varied; the recess can be varied in size and shape (or omitted entirely), and other form-factor modifications made.

In some embodiments, a package can include a primary lens or other refractive media and/or optically transparent media overlying and protecting the LEDs on the substrate. A packages can be incorporated into a lamp having any desired form factor; for example, using the compact substrates described herein, a lamp can be sized and shaped as a replacement for existing incandescent, halogen, or compact fluorescent light bulbs. Entirely new form factors are also contemplated. A lamp can incorporate a heat sink and/or any other thermal management structures that may be desirable to keep the bottom surface of the substrate sufficiently cool, i.e., at a temperature that provides safe operation of the LED given the intended device power and $\theta_{JC}$ of a particular substrate.

Thus, although the invention has been described with respect to specific embodiments, it will be appreciated that the invention is intended to cover all modifications and equivalents within the scope of the following claims.

What is claimed is:

1. A lighting apparatus comprising:
   a substrate having:
   a plurality of electrically insulating base layers;
   a plurality of external electrical contacts disposed on an exterior surface of the substrate;
   a plurality of top-side pads including a plurality of light device pads and a plurality of auxiliary electrical bond pads, each light device bond pad being sized and positioned to accommodate a light device, each auxiliary electrical bond pad being sized and positioned to accommodate a wire bond; and
   a plurality of electrical paths connecting at least some of the top-side pads to the external electrical contacts, wherein at least a portion of the plurality of electrical paths is disposed between the electrically insulating base layers; and
   a plurality of light devices, each light device disposed on one of the light device pads, at least one of the light devices being connected via a wire bond to one of the auxiliary electrical contacts,
   wherein the light devices are connected by the plurality of electrical paths in a plurality of independently addressable groups.

2. The lighting apparatus of claim 1 wherein at least one of the independently addressable groups includes at least two of the light devices.

3. The lighting apparatus of claim 1 wherein the number of auxiliary electrical bond pads is less than the number of light device bond pads.

4. The lighting apparatus of claim 1 wherein the number of auxiliary electrical bond pads is equal to the number of light device bond pads.

5. The lighting apparatus of claim 1 wherein the plurality of light devices includes a plurality of light-emitting diodes.

6. The lighting apparatus of claim 1 wherein the plurality of light devices includes at least twelve light-emitting diodes.

7. The lighting apparatus of claim 6 wherein the at least twelve light-emitting diodes are connected in two independently addressable groups.

8. The lighting apparatus of claim 1 wherein the light devices in a first one of the independently addressable groups are light devices that emit warm white light when operated and the light devices in a second one of the independently addressable groups are light devices that emit cool white light when operated.

9. The lighting apparatus of claim 1 wherein the plurality of top-side pads includes at least one pad that is sized and positioned to accommodate both a first one of the light devices and a wire bond to connect to a second one of the light devices.

10. The lighting apparatus of claim 1 further comprising a metal heat dissipation plate disposed on a bottom surface of the substrate, wherein the metal heat dissipation plate is electrically isolated from the plurality of electrical paths.

11. The lighting apparatus of claim 1 wherein an area of each of the light device pads is maximized subject to constraints of total area available for the light device pads and a minimum spacing between the light device pads to provide electrical isolation from each other.

12. The lighting apparatus of claim 1 further comprising at least one electrically insulating upper layer overlying the top one of the electrically insulating base layers, wherein each upper layer has an opening therethrough, the opening being sized and shaped such that at least a portion of each of the light device pads.

13. The lighting apparatus of claim 1 further comprising a primary lens overlying the plurality of light devices.

* * * * *